(12) United States Patent
Tripathi et al.

(10) Patent No.: US 10,447,246 B1
(45) Date of Patent: Oct. 15, 2019

(54) LOW VOLTAGE DIFFERENTIAL SIGNALING CIRCUIT

(71) Applicant: NXP USA, INC., Austin, TX (US)

(72) Inventors: Divya Tripathi, Noida (IN); Anil Kumar Gottapu, Vizianagaram (IN); Sanjay Kumar Wadhwa, Noida (IN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/181,518

(22) Filed: Nov. 6, 2018

(51) Int. Cl.
*H03K 3/011* (2006.01)
*H03K 3/356* (2006.01)

(52) U.S. Cl.
CPC ....... *H03K 3/011* (2013.01); *H03K 3/356034* (2013.01); *H03K 3/356069* (2013.01)

(58) Field of Classification Search
None
See application file for complete search history.

(56) References Cited

U.S. PATENT DOCUMENTS

| 5,977,796 A | 11/1999 | Gabara |
| 6,788,116 B1 | 9/2004 | Cook et al. |
| 6,992,508 B2 | 1/2006 | Chow |
| 2018/0115153 A1* | 4/2018 | Baik .................. F02D 41/20 |

* cited by examiner

*Primary Examiner* — Cassandra F Cox

(57) ABSTRACT

A low voltage differential signaling circuit includes an output driver circuit configured to provide a differential signal pair based on a first signal and a second signal. A peak detect circuit is coupled to receive the differential signal pair and configured to provide a feedback signal based on the differential signal pair and the first and second signals. An amplifier circuit has a first input coupled to the peak detect circuit, a second input coupled to receive a reference voltage, and an output coupled to provide a bias voltage to the output driver circuit.

20 Claims, 3 Drawing Sheets

LOW VOLTAGE DIFFERENTIAL SIGNALING CIRCUIT

BACKGROUND

Field

This disclosure relates generally to semiconductor devices, and more specifically, to low voltage differential signaling (LVDS) circuits in semiconductor devices.

Related Art

Modern integrated circuits include high frequency, high accuracy analog elements such as LVDS circuits for transmission of high-speed signals. Performance of these LVDS circuits can vary dramatically with variations in process, operating voltage, and temperature. A need therefore exists to provide a high performance LVDS circuit which is suitable for advanced process technologies and variations in operating conditions.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a low voltage differential signaling (LVDS) circuit configured to operate at low voltages (e.g., less than 1.0 volts) and generate a fixed differential output voltage (VOD) across process, temperature, and termination resistor variations. The LVDS circuit includes current source transistors that remain in saturation while allowing VOD to track a wide range of supply voltages (e.g., VDD). Positive and negative peak detect circuits of the LVDS circuit are configured to provide feedback signals without using an amplifier.

Figure 1:
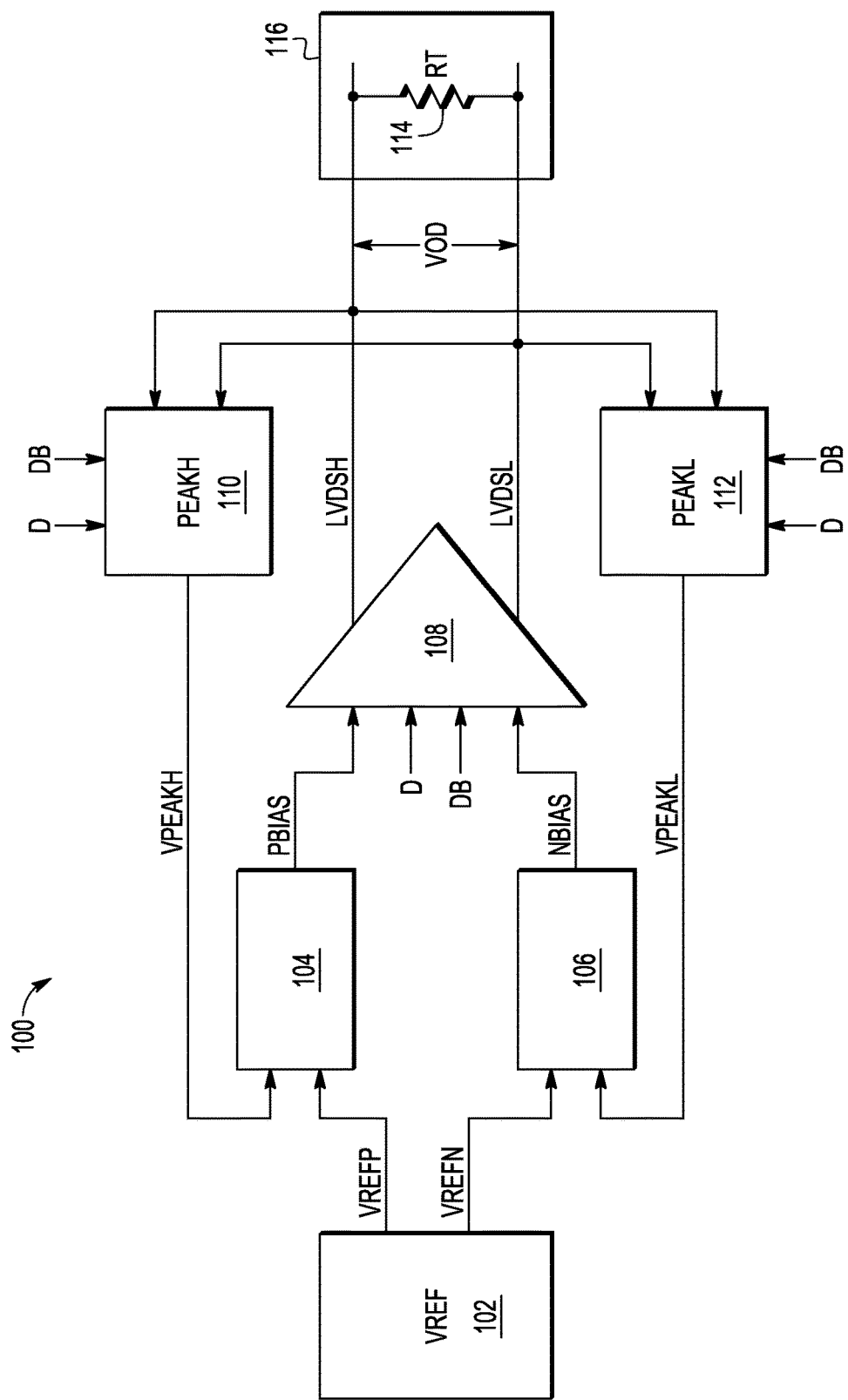
FIG. 1 illustrates, in block diagram form, an example low voltage differential signaling system in accordance with an embodiment.

FIG. 1 illustrates, in block diagram form, an example low voltage differential signaling (LVDS) transmitter system 100 in accordance with an embodiment. In this embodiment, the system 100 includes a differential output driver circuit 108, peak detect circuits 110 and 112, bias voltage amplifier circuits 104 and 106, and reference voltage generation circuit 102.

The driver circuit 108 has a first input coupled to receive an input signal label D and a second input coupled to receive a complement input signal labeled DB, where the DB signal is an inverse of the D signal. The input signals D and DB are characterized as digital signals such as respective true and complement versions of a clock signal, for example. The driver circuit 108 also includes a third input coupled to receive a first bias voltage signal labeled PBIAS and a fourth input coupled to receive a second bias voltage signal labeled NBIAS. The driver circuit 108 includes a first output and a second output which together forms a differential output pair. The driver circuit 108 is configured to provide a differential signal pair based on the D and DB signals. The differential signal pair includes a high signal labeled LVDSH provided at node labeled LVDSH connected at the first output and a low signal labeled LVDSL provided at node labeled LVDSL connected at the second output. The LVDSH and LVDSL signals are differential signals having an output voltage difference labeled VOD. In operation, the transmitted LVDSH and LVDSL signals are applied across a termination resistor 114 labeled RT at a receiver 116 which results in a current through resistor RT having a direction of the current flow indicative of the transmitted logic level.

The first peak detect circuit 110 labeled PEAKH includes a first pair of inputs coupled to receive the differential signal pair from the driver circuit 108 and a second pair of inputs coupled to receive the D and DB signals. The PEAKH detect circuit is configured to provide a high signal feedback signal labeled VPEAKH based on the differential signal pair and the D and DB signals. The PEAKH detect circuit effectively samples and holds voltage values from the LVDSH and LVDSL nodes to generate the VPEAKH feedback signal without using an amplifier (e.g., op amp).

The second peak detect circuit 112 labeled PEAKL includes a first pair of inputs coupled to receive the differential signal pair from the driver circuit 108 and a second pair of inputs coupled to receive the D and DB signals. The PEAKL detect circuit is configured to provide a low signal feedback signal labeled VPEAKL based on the differential signal pair and the D and DB signals. The PEAKL detect circuit effectively samples and holds voltage values from the LVDSH and LVDSL nodes to generate the VPEAKL feedback signal without using an amplifier such as an op amp, for example.

The first bias voltage amplifier circuit 104 includes a first input coupled to receive the VPEAKH feedback signal, a second input coupled to receive a first reference voltage labeled VREFP, and an output coupled to provide the first bias voltage labeled PBIAS to the driver circuit 108. The amplifier circuit 104 is configured to generate the PBIAS voltage based on the VREFP voltage and the VPEAKH feedback voltage.

The second bias voltage amplifier circuit 106 includes a first input coupled to receive the VPEAKL feedback signal, a second input coupled to receive a second reference voltage labeled VREFN, and an output coupled to provide the second bias voltage labeled NBIAS to the driver circuit 108. The amplifier circuit 106 is configured to generate the NBIAS voltage based on the VREFN voltage and the VPEAKL feedback voltage.

The reference voltage generation circuit 102 is coupled between voltage supplies such as VDD and VSS, for example, and includes a first output for providing the PBIAS bias voltage signal and a second output for providing the NBIAS bias voltage signal. The reference voltage generation circuit 102 may include any suitable voltage reference circuitry such as resistor divider circuitry, for example.

Figure 2:
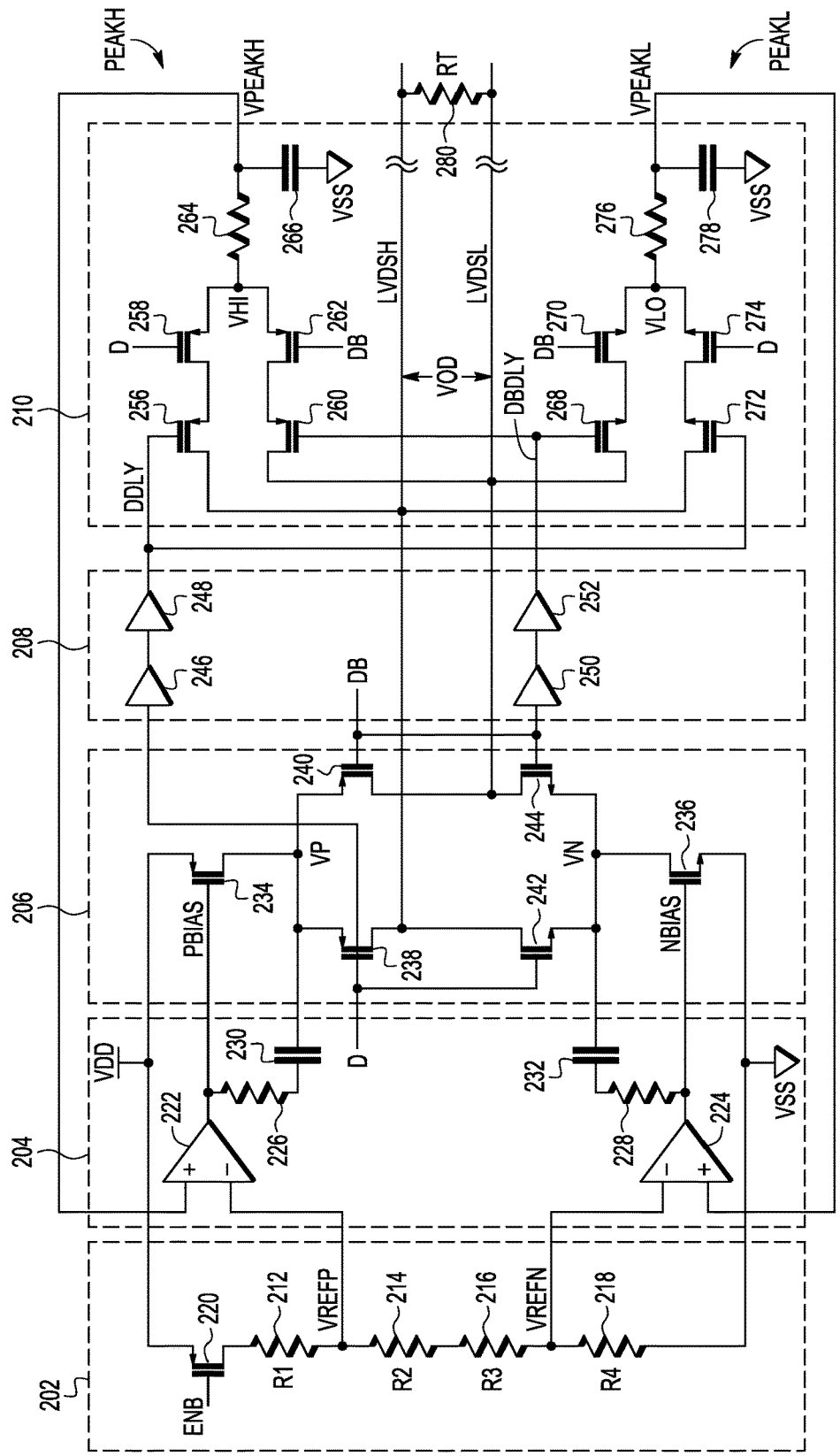
FIG. 2 illustrates, in schematic diagram form, a more detailed example low voltage differential signaling circuit in accordance with an embodiment.

FIG. 2 illustrates, in schematic diagram form, a more detailed example LVDS transmitter circuit 200 in accordance with an embodiment. In this embodiment, the transmitter circuit 200 includes differential output driver circuitry 206, peak detect circuitry 210 and delay circuitry 208, bias voltage amplifier circuitry 204, and reference voltage generation circuitry 202.

The driver circuit 206 includes P-channel transistors 234, 238-240 and N-channel transistors 236, 242-244. Transistor 234 is configured to form a bias current source and transistor 236 is configured to form a bias current sink. Transistors 238-240 and 242-244 are configured to form an H-bridge circuit coupled between the first and second current sources. A first current electrode of transistor 234 is coupled to a first voltage supply terminal (e.g., VDD) and a control electrode is coupled to receive the PBIAS voltage signal. A second current electrode of transistor 234 is coupled to a first current electrode of transistors 238 and 240 at node labeled VP. A second current electrode of transistor 238 is coupled to a first current electrode of transistor 242 at a first output node labeled LVDSH and a second current electrode of transistor 240 is coupled to a first current electrode of transistor 244 at a second output node labeled LVDSL. A termination resistor 280 labeled RT of a receiver circuit is coupled to receive a transmitted differential signal by way of output nodes LVDSH and LVDSL. A first current electrode of transistor 236 is coupled to a second current electrode of transistors 242 and 244 at node labeled VN. A second current electrode of transistor 236 is coupled to a second voltage supply terminal (e.g., VSS) and a control electrode is coupled to receive the NBIAS voltage signal. Control electrodes of transistors 238 and 242 are coupled to receive a first input signal labeled D and control electrodes of transistors 240 and 244 are coupled to receive a complement input signal labeled DB, where the DB signal is an inverted form of the D signal. The input signals D and DB are characterized as digital signals such as respective true and complement versions of a clock signal, for example.

The peak detect circuitry 210 includes a high peak detect circuit configured to provide a high feedback signal and a low peak detect circuit configured to provide a low feedback signal. The high peak detect circuit includes P-channel transistors 256-262, resistor 264, and capacitor 266. A first current electrode of transistor 256 is coupled at the LVDSH node and a second current electrode of transistor 256 is coupled to a first current electrode of transistor 258. A first current electrode of transistor 260 is coupled at the LVDSL node and a second current electrode of transistor 260 is coupled to a first current electrode of transistor 262. A second current electrode of transistor 258, a second current electrode of transistor 262, and a first terminal of resistor 264 are coupled to each other at node labeled VHI. A second terminal of resistor 264 is coupled to a first terminal of capacitor 266 at node labeled VPEAKH and a second terminal of capacitor 266 is coupled to the second voltage supply terminal (e.g., VSS). A control electrode of transistor 258 is coupled to receive the D signal and a control electrode of transistor 256 is coupled to receive a delay signal labeled DDLY. The delay signal DDLY is a delayed version of the D signal. A control electrode of transistor 262 is coupled to receive the DB signal and a control electrode of transistor 260 is coupled to receive a delay signal labeled DBDLY. The delay signal DBDLY is a delayed version of the DB signal. A feedback voltage signal VPEAKH corresponding to a maximum peak voltage of a differential output signal pair is provided at the VPEAKH node.

The low peak detect circuit includes N-channel transistors 268-274, resistor 276, and capacitor 278. A first current electrode of transistor 272 is coupled at the LVDSH node and a second current electrode of transistor 272 is coupled to a first current electrode of transistor 274. A first current electrode of transistor 268 is coupled at the LVDSL node and a second current electrode of transistor 268 is coupled to a first current electrode of transistor 270. A second current electrode of transistor 270, a second current electrode of transistor 274, and a first terminal of resistor 276 are coupled to each other at node labeled VLO. A second terminal of resistor 276 is coupled to a first terminal of capacitor 278 at node labeled VPEAKL and a second terminal of capacitor 278 is coupled to the second voltage supply terminal. A control electrode of transistor 274 is coupled to receive the D signal and a control electrode of transistor 272 is coupled to receive the delay signal labeled DDLY. A control electrode of transistor 270 is coupled to receive the DB signal and a control electrode of transistor 268 is coupled to receive the delay signal labeled DBDLY. A feedback voltage signal VPEAKL corresponding to a minimum peak voltage of the differential output signal pair is provided at the VPEAKL node.

The delay circuitry 208 includes a first pair of delay buffers coupled in series to provide the DDLY signal and a second pair of delay buffers coupled in series to provide the DBDLY signal. An input of buffer 246 is coupled to receive the D signal and an output of buffer 246 is coupled to the input of buffer 248. An output of buffer 248 is coupled to provide the DDLY signal at node labeled DDLY. Likewise, an input of buffer 250 is coupled to receive the DB signal and an output of buffer 250 is coupled to the input of buffer 252. An output of buffer 252 is coupled to provide the DBDLY signal at node labeled DBDLY. In an embodiment, the DDLY signal is delayed from the D signal by approximately 0.5 nanoseconds (nS) and similarly the DBDLY signal is delayed from the DB signal by approximately 0.5 nS.

The bias voltage amplifier circuitry 204 includes a first bias voltage amplifier circuit configured to provide the PBIAS voltage signal and a second bias voltage amplifier circuit configured to provide the NBIAS voltage signal. The first bias voltage amplifier circuit includes a first amplifier (e.g., op amp) 222 and a first compensation circuit. A non-inverting input of amplifier 222 is coupled to receive the VPEAKH feedback signal and an inverting input of amplifier 222 is coupled to receive a first reference voltage VREFP at node labeled VREFP. An output of amplifier 222 is coupled to provide the PBIAS voltage signal at node labeled PBIAS. The first compensation circuit include resistor 226 and capacitor 230 coupled in series between the PBIAS node and the VP node of the H-bridge. Likewise, the second bias voltage amplifier circuit includes a second amplifier (e.g., op amp) 224 and a second compensation circuit. A non-inverting input of amplifier 224 is coupled to receive the VPEAKL feedback signal and an inverting input of amplifier 224 is coupled to receive a second reference voltage VREFN at node labeled VREFN. An output of amplifier 224 is coupled to provide the NBIAS voltage signal at node labeled NBIAS. The second compensation circuit include resistor 228 and capacitor 232 coupled in series between the NBIAS node and the VN node of the H-bridge.

The reference voltage generation circuitry 202 is coupled between the first and second voltage supply terminals and is configured to provide the VREFP and VREFN reference voltages to the amplifiers 222 and 224 respectively. In this embodiment, the reference voltage generation circuitry 202 includes a switch coupled in series with a resistor divider. The switch is implemented as a P-channel transistor 220 having a first current electrode coupled to the first voltage supply terminal (e.g., VDD), a second current electrode coupled to a first terminal of resistor R1 (212), and a control electrode coupled to receive an enable signal labeled ENB. The LVDS circuit 200 is enabled when the ENB signal is at a logic low level. A second terminal of resistor R1 is coupled to a first terminal of resistor R2 (214) at node VREFP and a second terminal of resistor R2 is coupled to a first terminal of resistor R3 (216). A second terminal of resistor R3 is coupled to a first terminal of resistor R4 (218) at node VREFN and a second terminal of resistor R4 is coupled to the second voltage supply terminal (e.g., VSS). In this embodiment, resistors R1 through R4 are configured or programmed to have the same resistance value such that the VREFP voltage is approximately 75% of the first voltage supply (e.g., 0.75*VDD) and the VREFN voltage is approximately 25% of the first voltage supply (e.g., 0.25*VDD). In other embodiments, resistors R1 through R4 may be configured or programmed such that the reference voltage generation circuitry 202 provides other VREFP and VREFN values. In other embodiments, other suitable voltage reference circuitry may be employed to provide the VREFP and VREFN reference voltages.

Figure 3:
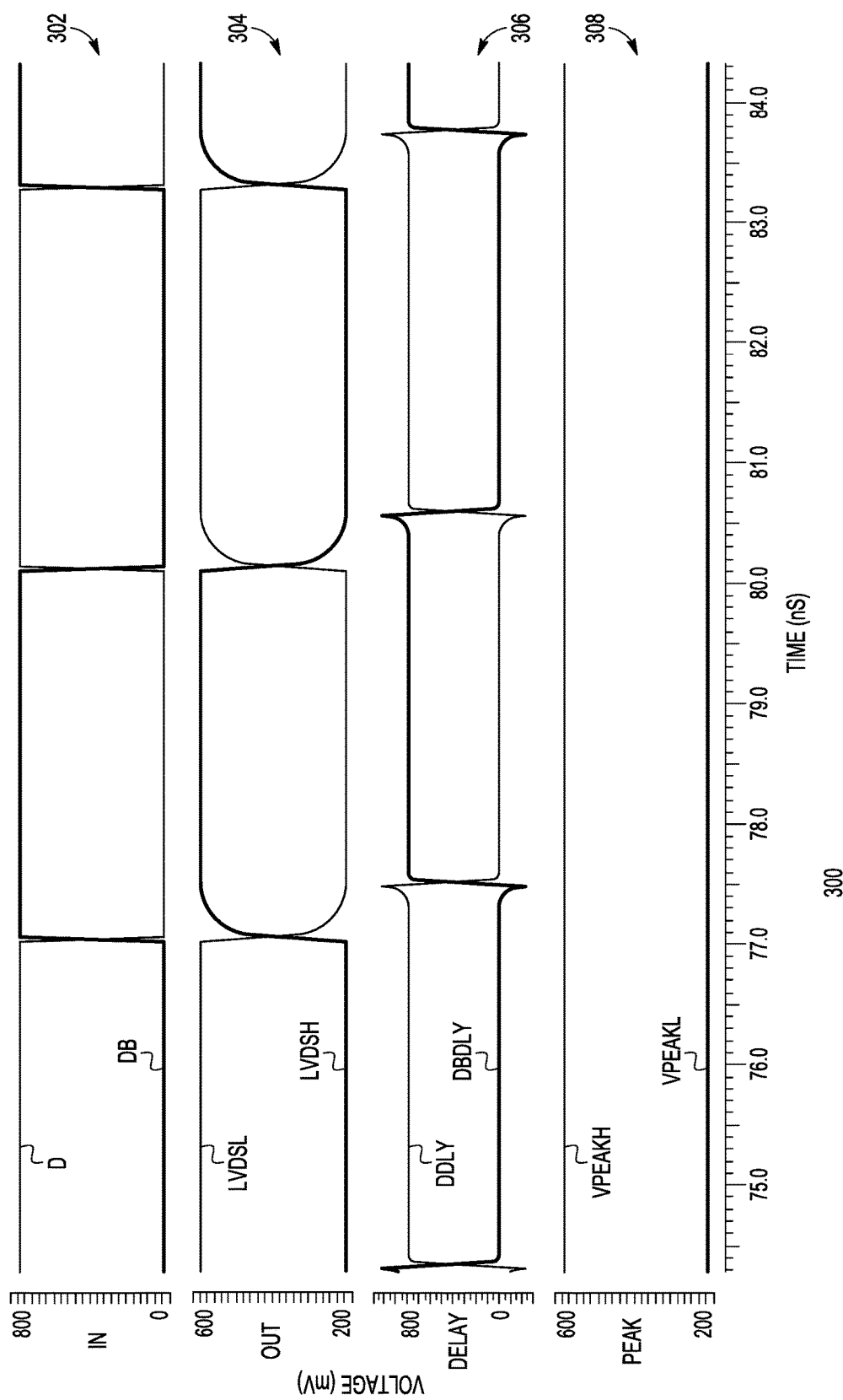
FIG. 3 illustrates, in plot diagram form, example low voltage differential signaling circuit simulation results in accordance with an embodiment.

FIG. 3 illustrates, in plot diagram form, example simulation results 300 of low voltage differential signaling circuit 200 in accordance with an embodiment. The plot diagram 300 include plots of complementary input signal pair 302 labeled IN, differential output signal pair 304 labeled OUT, delayed signal pair 306 labeled DELAY, and peak feedback signal pair 308 labeled PEAK. Time values are shown in nanoseconds (nS) on the X-axis, and voltage values are shown in millivolts (mV) on the Y-axis. Plot 302 includes waveforms labeled D and DB depicting digital input signals D and DB. Plot 304 includes waveforms labeled LVDSL and LVDSH depicting differential output signal pair at output nodes LVDSL and LVDSH. Plot 306 includes waveforms labeled DDLY and DBDLY depicting delayed versions of signals D and DB. Plot 308 includes waveforms labeled VPEAKH and VPEAKL depicting peak feedback voltage signals VPEAKH and VPEAKL.

Operation of the transmitter circuit 200 is further described by way of the following example including simulation results of FIG. 3. In this example, the transmitter circuit 200 is configured with VDD=0.8 volts, VREFP=0.6 volts (75% of VDD), VREFN=0.2 volts (25% of VDD), and RT=100 ohms. When signal D is at a logic high level and complement signal DB is at a logic low level, transistors 240 and 242 of the H-bridge are turned on causing a voltage level of approximately 200 mV at the LVDSH output and a voltage level of approximately 600 mV at the LVDSL output. With transistors 240 and 242 turned on, a current (I) flows through the termination resistor RT. The current I through termination resistor RT is essentially the current flowing through current bias transistors 234 and 236 in steady state. Thus, a differential output voltage (VOD) is generated across the termination resistor RT and is given by VOD=I*RT=$V_{LVDSH}$-$V_{LVDSL}$, where $V_{LVDSH}$ is the voltage at the LVDSH output and $V_{LVDSL}$ is the voltage at the LVDSL output. The polarity of the current flow corresponds to a logic value of the transmitted signal. Because current bias transistors 234 and 236 are configured to remain in saturation, the current I remains constant over process and temperature variations. When signal D transitions to a logic low level and signal DB transitions to a logic high level, transistors 240 and 242 are turned off and transistors 238 and 244 are turned on. With transistors 238 and 244 turned on, current I flows in an opposite direction through the termination resistor RT.

In steady state conditions, the peak feedback voltage signal VPEAKH will be substantially equal to VREFP and the peak feedback voltage signal VPEAKL will be substantially equal to VREFN. Thus, during a transition, both LVDSH and LVDSL signals will swing between the voltage levels VREFP and VREFN. Since VREFP and VREFN are dependent on VDD, the differential output voltage VOD will also depend on VDD. For example, as VDD increases, VOD increases and vice-versa. As the differential output voltage VOD tracks VDD, the current bias transistors 234 and 236 remain in saturation, thereby maintaining the current I constant across process and temperature variations.

Peak detect circuitry 210 effectively samples voltage values at the LVDSH and LVDSL output nodes and holds the sampled values until a next logic state transition of the D and DB signals. Delay signals DDLY and DBDLY are timed to minimize switching effects in the peak feedback voltage signals VPEAKH and VPEAKL during the logic state transitions. The VPEAKH and VPEAKL signals are fed back to inputs of amplifiers 222 and 224 and compared with reference voltages VREFP and VREFN to generate the respective PBIAS and NBIAS signals. The current I through current bias transistors 234 and 236 is based on the PBIAS and NBIAS signals.

Generally, there is provided, a low voltage differential signaling circuit including an output driver circuit configured to provide a differential signal pair at a differential output pair based on a first signal and a second signal, the second signal a complement of the first signal; a first peak detect circuit coupled to receive the differential signal pair and configured to provide a first feedback signal based on the differential signal pair and the first and second signals; and a first amplifier circuit having a first input coupled to the first peak detect circuit, a second input coupled to receive a first reference voltage, and an output coupled to provide a first bias voltage to the output driver circuit. The first peak detect circuit may include a first transistor having a first current electrode coupled at a first node and a control electrode coupled to receive the first signal; and a second transistor having a first current electrode coupled to the first current electrode of the first transistor at the first node and a control electrode coupled to receive the second signal. The first peak detect circuit may further include a third transistor having a first current electrode coupled to a second current electrode of the first transistor, a second current electrode coupled at the differential output pair, and a control electrode coupled to receive a first delay signal, the first delay signal a delayed version of the first signal; and a fourth transistor having a first current electrode coupled to a second current electrode of the second transistor, a second current electrode coupled at the differential output pair, and a control electrode coupled to receive a second delay signal, the second delay signal a delayed version of the second signal. The first peak detect circuit may further include a filter circuit which may include a resistor having a first terminal coupled at the first node and a second terminal coupled to the first input of the first amplifier circuit; and a capacitor having a first terminal coupled at the second terminal of the resistor and a second terminal coupled to a first voltage supply. The circuit may further include a second peak detect circuit coupled to receive the differential signal pair and configured to provide a second feedback signal based on the differential signal pair and the first and second signals; and a second amplifier circuit having a first input coupled to the second peak detect circuit, a second input coupled to receive a second reference voltage, and an output coupled to provide a second bias voltage to the output driver circuit. The output driver circuit may further include a first transistor having a first current electrode coupled at a first voltage supply and a control electrode coupled to receive the first bias voltage; a second transistor having a first current electrode coupled at a second voltage supply and a control electrode coupled to receive the second bias voltage; and an H-bridge circuit coupled to a second current electrode of the first transistor and a second current electrode of the second transistor, the H-bridge circuit having a first input coupled to receive the first signal, a second input coupled to receive the second signal, and the differential output pair for providing the differential signal pair. The circuit may further include a reference divider circuit coupled between the first voltage supply and the second voltage supply, the reference divider circuit configured to provide the first bias voltage at a first output and the second bias voltage at a second output, and wherein the first bias voltage is approximately 75% of the first voltage supply and the second bias voltage is approximately 25% of the first voltage supply. The circuit may further include a first resistor having a first terminal coupled to the output of the first amplifier circuit and the control terminal of the first transistor; a first capacitor having a first terminal coupled to a second terminal of the first resistor and a second terminal coupled to the second current electrode of the first transistor; a second resistor having a first terminal coupled to the output of the second amplifier circuit and the control terminal of the second transistor; and a second capacitor having a first terminal coupled to a second terminal of the second resistor and a second terminal coupled to the second current electrode of the second transistor. The H-bridge circuit may include a third transistor having a first current electrode coupled to the second current electrode of the first transistor and a control electrode coupled at the first input; a fourth transistor having a first current electrode coupled to a second current electrode of the third transistor at a first output of the differential output pair, a second current electrode coupled to the second current electrode of the second transistor, and a control electrode coupled to the control electrode of the third transistor at the first input; a fifth transistor having a first current electrode coupled to the second current electrode of the first transistor and a control electrode coupled at the second input; and a sixth transistor having a first current electrode coupled to a second current electrode of the fifth transistor at a second output of the differential output pair, a second current electrode coupled to the second current electrode of the second transistor, and a control electrode coupled to the control electrode of the fifth transistor at the second input.

In another embodiment, there is provided, a low voltage differential signaling circuit including a differential driver circuit configured to provide a differential signal pair in response to a first signal and a second signal, the second signal a complement of the first signal; a first peak detect circuit coupled to receive the differential signal pair and configured to provide a first feedback signal based on the differential signal pair and the first and second signals; and a first amplifier circuit having a first input coupled to receive the first feedback signal, a second input coupled to receive a first reference voltage, and an output coupled to provide a first bias voltage to the differential driver circuit. The first peak detect circuit may include a first transistor having a first current electrode coupled at a first node and a control electrode coupled to receive the first signal; a second transistor having a first current electrode coupled to a second current electrode of the first transistor and a control electrode coupled to receive a first delay signal; a third transistor having a first current electrode coupled to the first current electrode of the first transistor at the first node and a control electrode coupled to receive the second signal; and a fourth transistor having a first current electrode coupled to a second current electrode of the third transistor and a control electrode coupled to receive a second delay signal; wherein a second current electrode of the second transistor and a second current electrode of the fourth transistor are coupled to receive the differential signal pair. The circuit may further include a delay circuit configured to provide the first delay signal at a first output as a delayed version of the first signal received at a first input and to provide the second delay signal at a second output as a delayed version of the second signal received at a second input. The first peak detect circuit may further include a resistor having a first terminal coupled at the first node and a second terminal coupled to the first input of the first amplifier circuit; and a capacitor having a first terminal coupled at the second terminal of the resistor and a second terminal coupled to a first voltage supply. The circuit may further include a second peak detect circuit coupled to receive the differential signal pair and configured to provide a second feedback signal based on the differential signal pair and the first and second signals; and a second amplifier circuit having a first input coupled to receive the second feedback signal, a second input coupled to receive a second reference voltage, and an output coupled to provide a second bias voltage to the differential driver circuit. The circuit may further include a resistor divider circuit coupled between a first voltage supply and a second voltage supply, the resistor divider circuit configured to provide the first bias voltage at a first output and the second bias voltage at a second output. The circuit may further include a first compensation circuit having a first terminal coupled to the output of the first amplifier circuit and a second terminal coupled to the differential driver circuit; and a second compensation circuit having a first terminal coupled to the output of the second amplifier circuit and a second terminal coupled to the differential driver circuit.

In yet another embodiment, there is provided, a low voltage differential signaling circuit including an output driver circuit having a first input coupled to receive a first signal, a second input coupled to receive a second signal, and a differential output pair formed by a first output and a second output, the output driver circuit configured to provide a differential signal pair at the differential output pair based on the first signal and the second signal; a first peak detect circuit coupled to the differential output pair and configured to provide a first feedback signal based on the differential signal pair and the first and second signals; and a first amplifier circuit having a first input coupled to receive the first feedback signal, a second input coupled to receive a first reference voltage, and an output coupled to provide a first bias voltage to the output driver circuit. The first peak detect circuit may include a first transistor having a first current electrode coupled at a first node and a control electrode coupled to receive the first signal; a second transistor having a first current electrode coupled to a second current electrode of the first transistor, a second current electrode coupled to the first output, and a control electrode coupled to receive a first delay signal, the first delay signal characterized as a delayed version of the first signal; a third transistor having a first current electrode coupled to the first current electrode of the first transistor at the first node and a control electrode coupled to receive the second signal; and a fourth transistor having a first current electrode coupled to a second current electrode of the third transistor, a second current electrode coupled to the second output, and a control electrode coupled to receive a second delay signal, the second delay signal characterized as a delayed version of the second signal. The circuit may further include a second peak detect circuit coupled to the differential output pair and configured to provide a second feedback signal based on the differential signal pair and the first and second signals; and a second amplifier circuit having a first input coupled to receive the second feedback signal, a second input coupled to receive a second reference voltage, and an output coupled to provide a second bias voltage to the output driver circuit. The circuit may further include a reference divider circuit coupled between a first voltage supply and a second voltage supply, the reference divider circuit configured to provide the first bias voltage at a first output and the second bias voltage at a second output.

By now it should be appreciated that there has been provided, a low voltage differential signaling (LVDS) circuit configured to operate at low voltages (e.g., less than 1.0 volts) and generate a fixed differential output voltage (VOD) across process and temperature variations. The LVDS circuit includes current source transistors that remain in saturation while allowing VOD to track a wide range of supply voltages (e.g., VDD). Positive and negative peak detect circuits of the LVDS circuit are configured to provide feedback signals without using an amplifier.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A low voltage differential signaling circuit comprising:
   an output driver circuit configured to provide a differential signal pair at a differential output pair based on a first signal and a second signal, the second signal a complement of the first signal;
   a first peak detect circuit coupled to receive the differential signal pair and configured to provide a first feedback signal based on the differential signal pair and the first and second signals; and
   a first amplifier circuit having a first input coupled to the first peak detect circuit, a second input coupled to receive a first reference voltage, and an output coupled to provide a first bias voltage to the output driver circuit.

2. The circuit of claim 1, wherein the first peak detect circuit comprises:
   a first transistor having a first current electrode coupled at a first node and a control electrode coupled to receive the first signal; and
   a second transistor having a first current electrode coupled to the first current electrode of the first transistor at the first node and a control electrode coupled to receive the second signal.

3. The circuit of claim 2, wherein the first peak detect circuit further comprises:
   a third transistor having a first current electrode coupled to a second current electrode of the first transistor, a second current electrode coupled at the differential output pair, and a control electrode coupled to receive a first delay signal, the first delay signal a delayed version of the first signal; and
   a fourth transistor having a first current electrode coupled to a second current electrode of the second transistor, a second current electrode coupled at the differential output pair, and a control electrode coupled to receive a second delay signal, the second delay signal a delayed version of the second signal.

4. The circuit of claim 3, wherein the first peak detect circuit further comprises a filter circuit, the filter circuit comprising:
   a resistor having a first terminal coupled at the first node and a second terminal coupled to the first input of the first amplifier circuit; and
   a capacitor having a first terminal coupled at the second terminal of the resistor and a second terminal coupled to a first voltage supply.

5. The circuit of claim 1, further comprising:
   a second peak detect circuit coupled to receive the differential signal pair and configured to provide a second feedback signal based on the differential signal pair and the first and second signals; and
   a second amplifier circuit having a first input coupled to the second peak detect circuit, a second input coupled to receive a second reference voltage, and an output coupled to provide a second bias voltage to the output driver circuit.

6. The circuit of claim 5, wherein the output driver circuit further comprises:
a first transistor having a first current electrode coupled at a first voltage supply and a control electrode coupled to receive the first bias voltage;
a second transistor having a first current electrode coupled at a second voltage supply and a control electrode coupled to receive the second bias voltage; and
an H-bridge circuit coupled to a second current electrode of the first transistor and a second current electrode of the second transistor, the H-bridge circuit having a first input coupled to receive the first signal, a second input coupled to receive the second signal, and the differential output pair for providing the differential signal pair.

7. The circuit of claim 6, further comprising a reference divider circuit coupled between the first voltage supply and the second voltage supply, the reference divider circuit configured to provide the first bias voltage at a first output and the second bias voltage at a second output, and wherein the first bias voltage is approximately 75% of the first voltage supply and the second bias voltage is approximately 25% of the first voltage supply.

8. The circuit of claim 6, further comprising:
a first resistor having a first terminal coupled to the output of the first amplifier circuit and the control terminal of the first transistor;
a first capacitor having a first terminal coupled to a second terminal of the first resistor and a second terminal coupled to the second current electrode of the first transistor;
a second resistor having a first terminal coupled to the output of the second amplifier circuit and the control terminal of the second transistor; and
a second capacitor having a first terminal coupled to a second terminal of the second resistor and a second terminal coupled to the second current electrode of the second transistor.

9. The circuit of claim 6, wherein the H-bridge circuit comprises:
a third transistor having a first current electrode coupled to the second current electrode of the first transistor and a control electrode coupled at the first input;
a fourth transistor having a first current electrode coupled to a second current electrode of the third transistor at a first output of the differential output pair, a second current electrode coupled to the second current electrode of the second transistor, and a control electrode coupled to the control electrode of the third transistor at the first input;
a fifth transistor having a first current electrode coupled to the second current electrode of the first transistor and a control electrode coupled at the second input; and
a sixth transistor having a first current electrode coupled to a second current electrode of the fifth transistor at a second output of the differential output pair, a second current electrode coupled to the second current electrode of the second transistor, and a control electrode coupled to the control electrode of the fifth transistor at the second input.

10. A low voltage differential signaling circuit comprising:
a differential driver circuit configured to provide a differential signal pair in response to a first signal and a second signal, the second signal a complement of the first signal;
a first peak detect circuit coupled to receive the differential signal pair and configured to provide a first feedback signal based on the differential signal pair and the first and second signals; and
a first amplifier circuit having a first input coupled to receive the first feedback signal, a second input coupled to receive a first reference voltage, and an output coupled to provide a first bias voltage to the differential driver circuit.

11. The circuit of claim 10, wherein the first peak detect circuit comprises:
a first transistor having a first current electrode coupled at a first node and a control electrode coupled to receive the first signal;
a second transistor having a first current electrode coupled to a second current electrode of the first transistor and a control electrode coupled to receive a first delay signal;
a third transistor having a first current electrode coupled to the first current electrode of the first transistor at the first node and a control electrode coupled to receive the second signal; and
a fourth transistor having a first current electrode coupled to a second current electrode of the third transistor and a control electrode coupled to receive a second delay signal;
wherein a second current electrode of the second transistor and a second current electrode of the fourth transistor are coupled to receive the differential signal pair.

12. The circuit of claim 11, further comprising a delay circuit configured to provide the first delay signal at a first output as a delayed version of the first signal received at a first input and to provide the second delay signal at a second output as a delayed version of the second signal received at a second input.

13. The circuit of claim 11, wherein the first peak detect circuit further comprises:
a resistor having a first terminal coupled at the first node and a second terminal coupled to the first input of the first amplifier circuit; and
a capacitor having a first terminal coupled at the second terminal of the resistor and a second terminal coupled to a first voltage supply.

14. The circuit of claim 10, further comprising:
a second peak detect circuit coupled to receive the differential signal pair and configured to provide a second feedback signal based on the differential signal pair and the first and second signals; and
a second amplifier circuit having a first input coupled to receive the second feedback signal, a second input coupled to receive a second reference voltage, and an output coupled to provide a second bias voltage to the differential driver circuit.

15. The circuit of claim 14, further comprising a resistor divider circuit coupled between a first voltage supply and a second voltage supply, the resistor divider circuit configured to provide the first bias voltage at a first output and the second bias voltage at a second output.

16. The circuit of claim 14, further comprising:
a first compensation circuit having a first terminal coupled to the output of the first amplifier circuit and a second terminal coupled to the differential driver circuit; and
a second compensation circuit having a first terminal coupled to the output of the second amplifier circuit and a second terminal coupled to the differential driver circuit.

17. A low voltage differential signaling circuit comprising:
an output driver circuit having a first input coupled to receive a first signal, a second input coupled to receive a second signal, and a differential output pair formed by a first output and a second output, the output driver circuit configured to provide a differential signal pair at the differential output pair based on the first signal and the second signal;
a first peak detect circuit coupled to the differential output pair and configured to provide a first feedback signal based on the differential signal pair and the first and second signals; and
a first amplifier circuit having a first input coupled to receive the first feedback signal, a second input coupled to receive a first reference voltage, and an output coupled to provide a first bias voltage to the output driver circuit.

18. The circuit of claim 17, wherein the first peak detect circuit comprises:
a first transistor having a first current electrode coupled at a first node and a control electrode coupled to receive the first signal;
a second transistor having a first current electrode coupled to a second current electrode of the first transistor, a second current electrode coupled to the first output, and a control electrode coupled to receive a first delay signal, the first delay signal characterized as a delayed version of the first signal;
a third transistor having a first current electrode coupled to the first current electrode of the first transistor at the first node and a control electrode coupled to receive the second signal; and
a fourth transistor having a first current electrode coupled to a second current electrode of the third transistor, a second current electrode coupled to the second output, and a control electrode coupled to receive a second delay signal, the second delay signal characterized as a delayed version of the second signal.

19. The circuit of claim 17, further comprising:
a second peak detect circuit coupled to the differential output pair and configured to provide a second feedback signal based on the differential signal pair and the first and second signals; and
a second amplifier circuit having a first input coupled to receive the second feedback signal, a second input coupled to receive a second reference voltage, and an output coupled to provide a second bias voltage to the output driver circuit.

20. The circuit of claim 19, further comprising a reference divider circuit coupled between a first voltage supply and a second voltage supply, the reference divider circuit configured to provide the first bias voltage at a first output and the second bias voltage at a second output.

* * * * *